United States Patent [19]

Geary

[11] 4,262,339

[45] Apr. 14, 1981

[54] FERROELECTRIC DIGITAL DEVICE

[75] Inventor: John M. Geary, Summit, N.J.

[73] Assignee: Bell Telephone Laboratories, Incorporated, Murray Hill, N.J.

[21] Appl. No.: 27,611

[22] Filed: Apr. 5, 1979

[51] Int. Cl.³ .............................................. G11C 11/22
[52] U.S. Cl. ..................................... 365/145; 365/157
[58] Field of Search .................. 365/45, 94, 102, 145, 365/157

[56] References Cited

U.S. PATENT DOCUMENTS

| | | | |
|---|---|---|---|
| 2,864,079 | 12/1958 | Anderson | 365/145 |
| 3,142,044 | 7/1964 | Kaufman et al. | 365/145 |
| 3,142,045 | 7/1964 | Bobeck | 365/145 |
| 3,460,116 | 8/1969 | Bobeck et al. | |
| 3,508,222 | 4/1970 | Bobeck et al. | |
| 3,701,122 | 10/1972 | Geusic | 365/145 |
| 3,701,147 | 10/1972 | Whitehouse | 365/157 |
| 3,936,146 | 2/1976 | Kumada et al. | 350/149 |
| 3,953,109 | 4/1976 | Kunada | 350/160 R |

OTHER PUBLICATIONS

Kaufman, "Obtaining Nondestructive Readout with Ferroelectric Memories," *Electronics*, 8/25/61, pp. 47-51.
Jacobs et al., "Ferroelectric Devices", 1/73, vol. 15, No. 8, *IBM Tech. Disc. Bul.*, pp. 2403-2404.

*Primary Examiner*—Stuart N. Hecker
*Attorney, Agent, or Firm*—Peter A. Businger

[57] ABSTRACT

Digital devices such as, e.g., shift registers and logical gates are disclosed which are predicated on domain wall motion in a film of a ferroelectric material, such as, e.g., gadolinium molybdate or lead germanate. Disclosed devices comprise electrodes on both sides of the film of ferroelectric material and may further comprise a resistive layer whose presence facilitates domain wall motion past inter-electrode gaps. Electrodes or facing portions of electrodes define regions in the film and, in particular, an input region and an output region.

To facilitate series connection of devices, electrodes are designed so as to cause energy gain during device operation. According to such design, surface area of an output region is larger than surface area of an input region. A current sensor is electrically connected to an electrode defining such output region.

9 Claims, 12 Drawing Figures

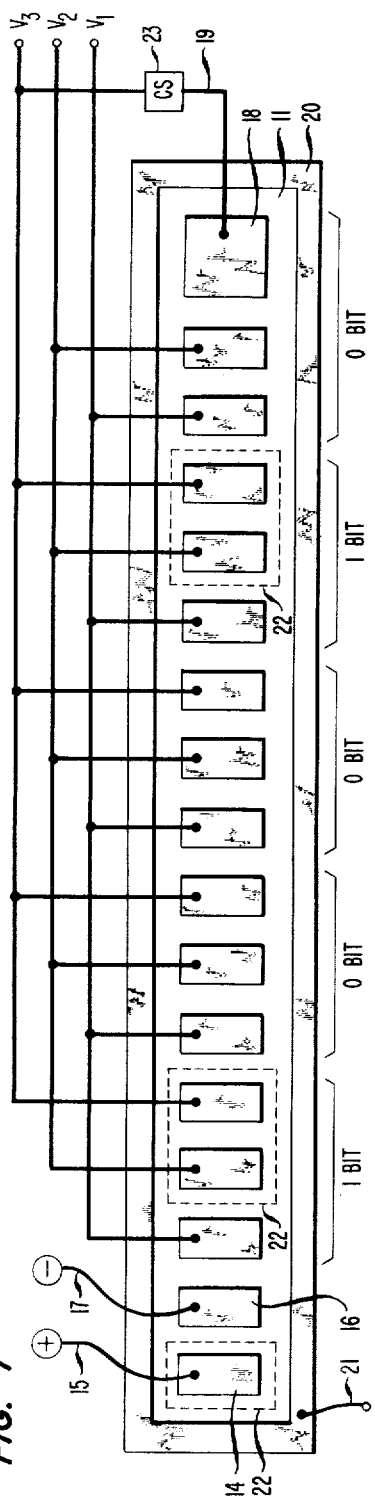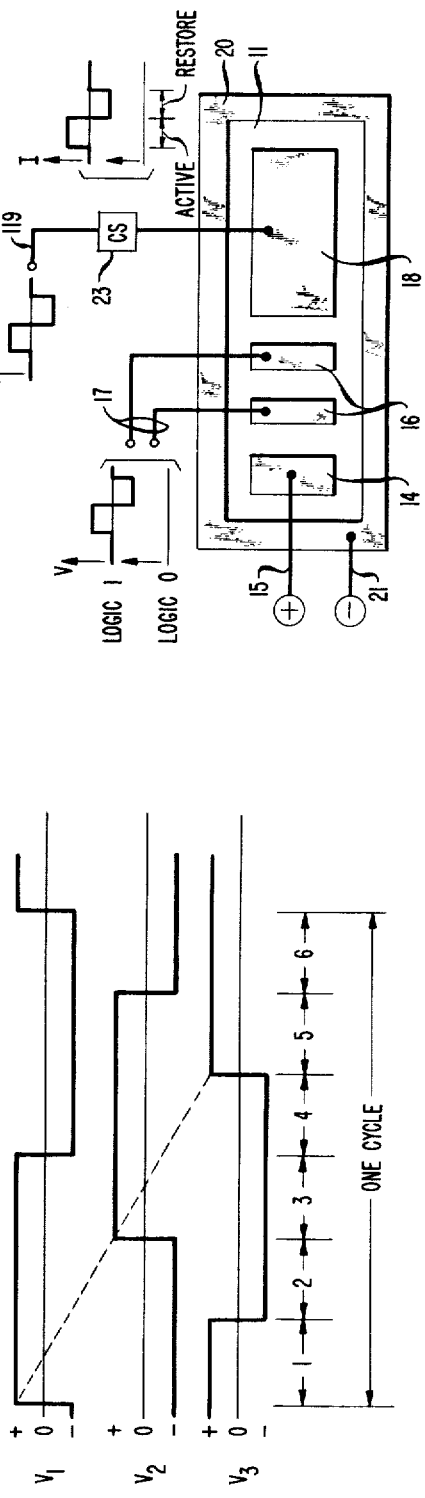
FIG. 7
FIG. 8
FIG. 9

FERROELECTRIC DIGITAL DEVICE

CROSS-REFERENCE TO RELATED APPLICATIONS

Concurrently filed are applications Ser. No. 027,612 and Ser. No. 027,613.

TECHNICAL FIELD

The invention is concerned with the use of ferroelectric materials in digital devices.

BACKGROUND OF THE INVENTION

Digital devices such as, e.g., memories, shift registers, logical gates, and arithmetic units may be based on a variety of physical phenomena among which electrical and magnetic effects have been most widely exploited. One class of devices which has recently evolved to the point of commercial viability is based on the creation, propagation, and sensing of magnetic domains in a layer of a magnetic material. Early embodiments of such devices are disclosed, e.g., in U.S. Pat. Nos. 3,460,116 (issued Aug. 5, 1966 in the name of A. H. Bobeck) and 3,508,222 (issued Apr. 21, 1970 in the same name). Device disclosed in these patents are, respectively, a shift register and a memory readout device. Use is made in such devices of minimum-energy ferromagnetic domains, known in the art as magnetic bubbles, which are magnetized opposite to the general direction of magnetization of a layer of magnetic material.

A different class of devices, based on the use of ferroelectric materials, is in some respects similar to the class of magnetic bubble devices. However, the analogy between magnetic bubble devices and ferroelectric devices is incomplete and, in fact, no minimum-energy ferroelectric domains analogous to magnetic bubbles are known to exist. Ferroelectric devices are disclosed, e.g., in U.S. Pat. No. 3,142,045 (issued July 21, 1964 in the name of A. H. Bobeck) which discloses circuitry suitable for implementing a shift register. Various ferroelectric materials are disclosed in U.S. Pat. No. 3,936,146 (issued Feb. 3, 1976 in the name of A. Kumada et al) in the context of optical devices based on birefringence; similar devices are disclosed in U.S. Pat. No. 3,953,109 (issued Apr. 27, 1976 in the name of A. Kumada). Readout from ferroelectric devices is a concern of U.S. Pat. No. 3,701,122 (issued Oct. 24, 1972 in the name of J. E. Geusic et al) which discloses a shift register whose contents are read by an optical projection method.

Though established as to feasibility, digital devices based on ferroelectric materials have been developed to a lesser extent than those based on magnetic materials. In particular, development is incomplete, e.g., with regard to series coupling of devices and attendant need for energy gain by individual devices.

SUMMARY OF THE INVENTION

Digital devices based on domain wall motion in a ferroelectric material are provided with an electric readout which allows for one or more type of gain such as e.g., charge gain, current gain, voltage gain, power gain, and energy gain. Devices of the invention comprise a film of a ferroelectric material having at least three different regions as defined by electrodes on the film. A first region which is conveniently designated trigger region has a smaller area than a second region which is conveniently designated detector region, the latter preferably having a surface area at least 50 percent greater than the former. A third region which is intermediate to trigger and detector regions can serve as a path for a ferroelectric domain wall moving from the trigger region to the detector region. Upon application of suitable voltage signals to electrodes defining trigger and detector regions, an output signal is sensed by a current sensor which is electrically connected to the latter electrode.

Devices of the invention may function, e.g., as amplifiers, logical gates, and shift register memories.

BRIEF DESCRIPTION OF THE DRAWING

FIG. 7 illustrates schematically and in top view a shift register memory according to the invention;

FIG. 8 graphically depicts voltage versus time of three voltage supplies as called for in the operation of the shift register shown in FIG. 7;

FIGS. 9 and 10 are schematic top views of exemplary logical gates according to the invention;

DETAILED DESCRIPTION

Devices of the invention comprise a ferroelectric material (which may also be ferroelastic) and which permits two preferred electrical polarization states. The ferroelectric material may be, e.g., in the form of a single-crystal, self-supporting film or slab, a membrane supported at its edges, or a layer or film deposited on a substrate. Unless specifically differentiated in the following, such forms are understood to be interchangeable in the context of the invention; for the sake of convenience, such forms are collectively designated by the term "film". Directions of preferred polarization are generally perpendicular to the broad faces of such film. The device further comprises electrodes which may be conveniently attached to or deposited on the broad faces of the film of ferroelectric material.

Devices of the invention permit the simultaneous presence of regions or domains of either polarization in the ferroelectric material, domains of opposite polarization being separated by a domain wall which is generally parallel to the preferred polarization directions and generally perpendicular to the faces of the film. A domain expands in the presence of an electric field having a component which is parallel to the polarization of a domain; conversely, a domain contracts in the presence of a field having a component which is antiparallel to the polarization of the domain. For the sake of ease of description, ferroelectric films in the following are depicted horizontal and having upward and downward polarized domains.

As a domain expands or contracts in response to a voltage applied to electrodes, a current flows in leads to the electrodes. If electrodes are in intimate contact with facing sides of a ferroelectric film, and if a ferroelectric domain wall passes between the electrodes, then current is induced in the amount $$I = 2 P_s \frac{dS}{dt}.$$

where $P_s$ denotes spontaneous polarization and S is the area of the downward polarized domain between electrodes. Consequently, current is proportional to the rate at which electrode area is swept out by an advancing domain wall. Such current may be sensed as output signal and can be fed to other devices as input signal.

Figure 1:
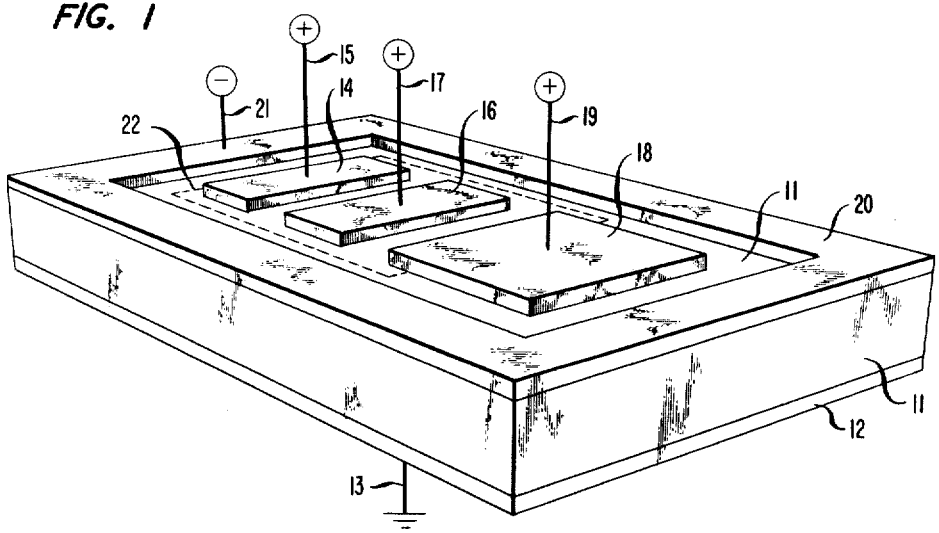
FIG. 1 shows in perspective and greatly enlarged an amplifying ferroelectric gating device according to the invention.
Figure 2:
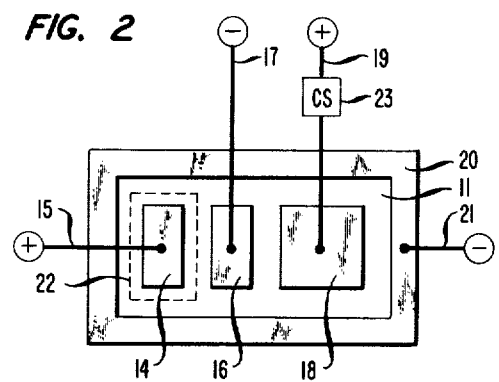
FIGS. 2-4 illustrate schematically and in top view three phases of an amplifying ferroelectric gating device according to the invention.

A basic structure of a signal amplification device according to the invention is shown in FIG. 1 and its operation is illustrated in FIGS. 2-2. FIGS. 1-4 show film 11 of a ferroelectric material on which are deposited ground electrode 12 with lead 13 and, on the facing broad side of film 11, origin electrode 14 with lead 15, trigger electrode 16 with lead 17, detector electrode 18 with lead 19, confiner electrode 20 with lead 21, outline 22 of upward polarized domain, and current sensor 23.

Figure 3:
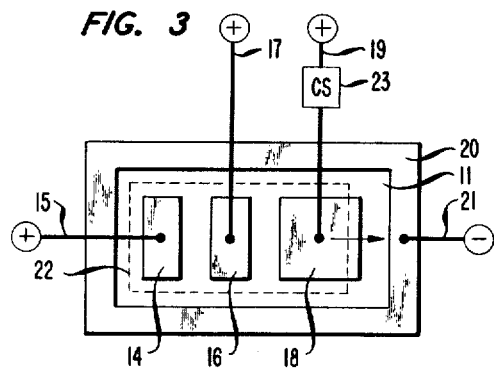
Figure 4:
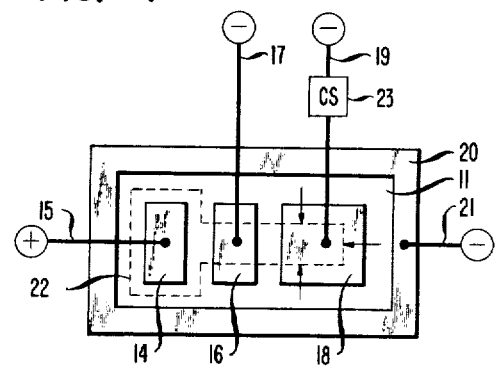

Functioning of devices of the invention is based on domain wall motion in the absence of nucleation of new domains. As long as a negative voltage is applied to lead 17, domain 22 is prevented from expanding to the right even in the presence of a positive voltage at lead 19. Upon application of a positive voltage to both trigger electrode 16 and detector electrode 18, domain 22 expands as shown in FIG. 3, causing a current pulse in current sensor 23. Upon application of a negative voltage to trigger electrode 17 and detector electrode 18, domain 22 contracts as shown in FIG. 4, causing a reverse current pulse in sensor 23. The final state of the device is again as shown in FIG. 2. During the entire cycle of operation of the device, domain 22 remains confined by the field established around its perimeter by confiner electrode 20.

According to the invention, various types of gain such as gain in electrical charge, current, voltage, power, and energy are realized by the ferroelectric device. As a domain wall advances past detector electrode 18, conduction charge on electrode 18 changes in response to the change of spontaneous polarization in film 11. As a result, a current flows in lead 19 as described above. Since total electrical charge in the current pulses in leads 17 and 19 is proportional to the areas of electrodes 16 and 18, respectively, charge gain is realized by choosing detector electrode area greater than trigger electrode area. In practice, detector area is at least 50 percent and, preferably, at least 100 percent greater than detector area. Furthermore, if a ferroelectric film has constant thickness and if origin, trigger, and detector electrodes have constant width, then current gain is $$G_{current} = \frac{V(v_d)}{V(v_t)}.$$

where $v_d$ and $v_t$ denote trigger and detector voltage, respectively, and where $V(v)$ denotes velocity of wall motion past an electrode as a function of voltage $v$ applied to such electrode. Consequently, when electrode widths are equal, current gain is realized when voltage applied to the detector electrode is greater than voltage applied to the trigger electrode. Alternately, when equal voltages are applied to trigger and detector electrodes, current gain is realized when the detector electrode has greater width than the trigger electrode.

Output voltage gain across a resistor which is placed in detector lead 19 may be realized in various ways. while general conditions for voltage gain may not be easily stated, a particularly simple case arises when electrodes 14, 16, and 18 have equal width as shown in FIGS. 1-4. For example, if W denotes such equal width, if R denotes load resistance, and if the detector supply voltage is $$v_{ds} = v_t + 2 P_s W R V(v_t),$$

when constant wall velocity under trigger and detector electrodes is realized. Under these conditions, voltage gain can be expressed by the formula $$G_{voltage} = v_{ds}/v_t - 1$$

and, consequently, gain greater than 1 is achieved when $$v_{ds} > 2v_t.$$

which is the case when $$2 P_s W R > v_t/V(v_t).$$

These same conditions also result in power gain which is defined as the ratio of power dissipated in a load resistor to the power input to the trigger lead. Finally, under these conditions, energy gain is $$G_{energy} = \frac{l_d}{l_t} ( \frac{v_{ds}}{v_t} - 1),$$

where $l_d$ and $l_t$ are the lengths of detector and trigger electrodes, respectively.

Conditions for the realization of various types of gain as presented above are contingent on inter-electrode current leakage being negligible. In practice, leakage between trigger electrode 16 and detector electrode 18 may be minimized when an additional, ring-shaped "guard" electrode surrounds electrode 18. If such additional electrode is connected to detector supply lead 19, leakage from the detector electrode is substantially blocked. As an alternative to the use of a guard ring electrode, current sensor 23 may be placed in ground lead 13 which carries the sum of trigger and detector currents.

Figure 5:
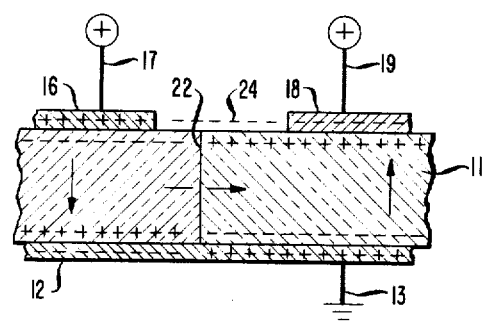
FIGS. 5 and 6 depict, in schematic cross section, charge distribution in a ferroelectric device in the absence and presence, respectively, of a resistive surface layer.
Figure 6:
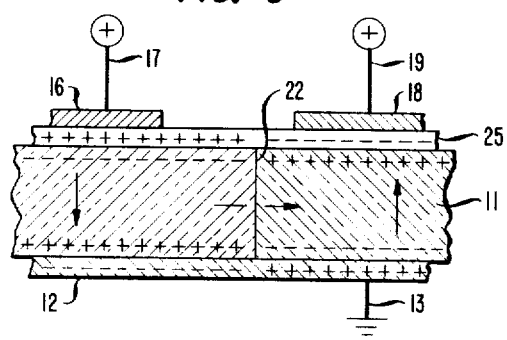

FIG. 5 shows charge configuration in a portion of a device of the invention during movement of a domain wall. While domain wall 22 is positioned under electrode 16, surface charge 24 compensates for ferroelectric polarization charge in layer 11. Upon application of positive voltages to leads 17 and 19, domain wall 22 moves to the right, encountering surface charges 24 whose presence opposes wall motion. To minimize opposing influence of surface charge, devices of the invention may be equipped with additional resistive layer 25 shown in FIG. 6. It can be seen that compensating charges are provided in layer 25 opposite surface charges in the ferroelectric material; as a result, domain wall 22 moves more freely in the inter-electrode gap. Resistive layer material is preferably chosen sufficiently conductive to allow for rapid movement as well as sufficiently resistive to prevent undue power dissipation between electrode. A resistive layer may be deposited contiguously as shown in FIG. 6; alternately, such layer may be deposited in inter-electrode gaps after deposition of electrodes directly on the ferroelectric material. Similar benefits may be realized by doping surface or bulk of the ferroelectric material, so as to impart slight conductivity, either before or after deposition of electrodes. In practice, resulting resistivity is at least 10 times resistivity of an overlying or adjoining electrode.

FIG. 7 shows a shift register in which 1-bits are represented in ferroelectric material 11 by downward polarized domains 22. In response to waveforms $V_1$, $V_2$, and $V_3$ as shown in FIG. 8 and as applied to corresponding leads shown in FIG. 7, domains 22 are moved from left to right. Each voltage cycle consists of the six stages shown in FIG. 8 and results in a shift of ferroelectric domains from one three-electrode position to the next. A domain advances by expanding to the right upon application of a positive voltage to the electrode to its immediate right, followed by pulling up from the left upon application of a negative voltage to the electrode to its immediate left. Domains 22 are launched from origin electrode 14 upon application of a positive voltage to trigger electrode 16; domains are sensed by current sensor 23 upon passage under detector electrode 18. Electrode 18 is shown covering a greater area than electrode 16, a factor which permits the realization of gain as described above.

FIG. 9 shows a device configuration having two trigger electrodes 16 which are arranged in series between electrode 14 and detector electrode 18. Output current is sensed by sensor 23 only if voltage signals are simultaneously applied to both leads 17; consequently, a logical AND function is realized. Depicted next to leads 17 are graphs of exemplary time-voltage relationship representing binary signals 0 and 1; specifically, the former is shown to correspond to absence of a signal and the latter to a pulse having a positive followed by a negative voltage. Similarly, detector supply voltage is depicted graphically next to lead 119.

Figure 10:
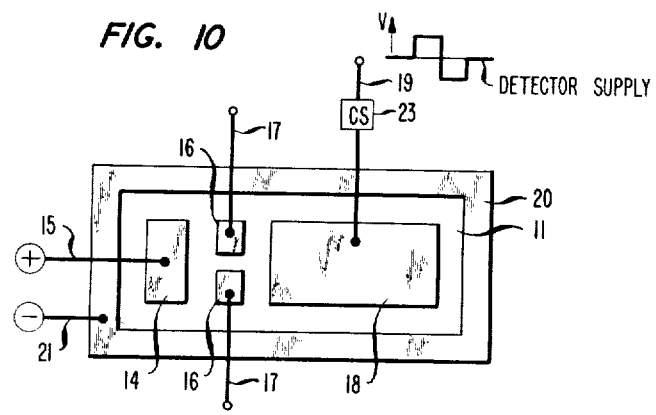

FIG. 10 shows a device configuration having two trigger electrodes which are arranged in parallel to allow for alternate, parallel paths between origin electrode 14 and detector electrode 18. Output current is sensed by sensor 23 if a voltage signal is applied to either of leads 17; consequently, a logical OR function is realized.

Figure 11:
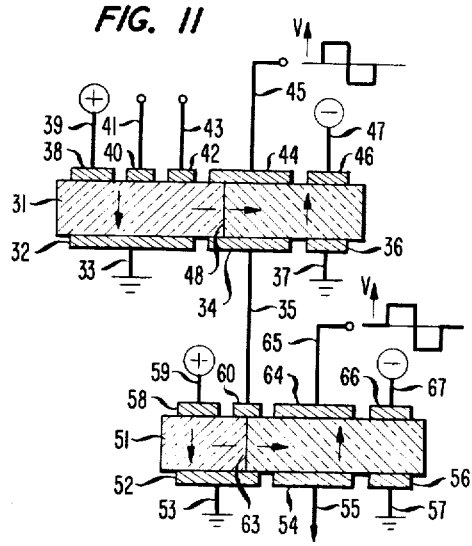
FIG. 11 shows schematically and in cross section series coupling of gates according to the invention.

FIG. 11 illustrates series coupling of devices in the case of an AND gate whose output is used as one of the input signals to an OR gate. The logical AND gate is shown comprising ferroelectric material 31, ground electrodes 32 and 36 with leads 33 and 37, detector bottom electrode 34 with lead 35, origin electrode 38 with lead 39, trigger electrodes 40 and 42 with leads 41 and 43, detector top electrode 44 with lead 45, confiner electrode 46 with lead 47, and moving domain wall 48. The logical OR gate is shown comprising ferroelectric material 51, ground electrodes 52 and 56 with leads 53 and 57, detector bottom electrode 54 with lead 55, origin electrode 58 with lead 59, trigger electrode 60, detector electrode 64 with lead 65, confiner electrode 66 with lead 67, and moving domain wall 68. Not shown is a second trigger electrode which is hidden by electrode 60. As a consequence of series connection of detector electrode 34 and trigger electrode 60 a domain wall moves past trigger electrode 60 if and only if a domain wall moves past detector electrode 35. For the sake of clarity of presentation, AND and OR gates in FIG. 11 are shown to be implemented by means of separate ferroelectric films; in practice, it may be convenient to choose implementation by means of a single film of ferroelectric material. To avoid leads passing through a single ferroelectric film, the OR gate is conveniently implemented inverted top-for-bottom next to the AND gate.

Figure 12:
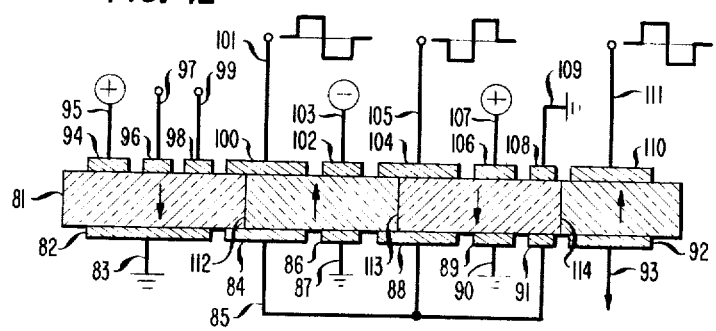
FIG. 12 shows schematically and in cross section a device implementing, in sequence, logical AND, NOT, and OR gates.

FIG. 12 illustrates implementation of three logical functions in series and by means of a single film 81 of ferroelectric material. A logical AND gate is shown comprising ground electrodes 82 and 86 with leads 83 and 87, detector bottom electrode 84 with lead 85, origin electrode 94 with lead 95, trigger electrodes 96 and 98 with leads 97 and 99, detector top electrode 100 with lead 101, confiner electrode 102 with lead 103, and ferroelectric domain wall 112. Further shown is a logical inversion gate comprising detector bottom electrode 88, detector top electrode 104 with lead 105, ground electrode 89 with lead 90, confiner electrode 106 with lead 107, and ferroelectric domain wall 113. Finally shown is a logical OR gate comprising trigger electrode 91, ground electrode 108 with lead 109, detector top electrode 110 with lead 111, detector bottom electrode with lead 93, and domain wall 114.

Operation of the device shown in FIG. 12 may be described as follows: If domain wall 112 moves past electrodes 84 and 100 upon simultaneous application of input pulses to leads 97 and 99, voltage of lead 85 remains zero because lead 85 is connected to identical structures to which compensating voltages are applied, normal power being supplied at lead 101 and inverted power at lead 105. As a result, no output signal is produced. Conversely, if domain wall 112 does not move due to a missing pulse either at leads 97 or 99, no ferroelectric current is provided to lead 85 by wall 112. However, current flows in lead 85 due to movement of wall 113, and, consequently, an output signal appears. Since the logical inversion device is activated by an inverted voltage signal as shown at lead 105, succeeding gates also require reversed polarity. If, however, a succeeding gate is inverted top-for-bottom, e.g., to avoid leads passing through the ferroelectric film, additional reversal results in a normal signal as applied, e.g., to lead 111.

It is a characterizing feature of devices described above that regions are defined in a ferroelectric film by means of electrodes on such film. Specifically defined are at least three adjacent regions, namely a first region here conveniently designated trigger region, a second region here conveniently designated detector region, and a third region which is intermediate to detector and trigger regions and which can serve as a path for a ferroelectric domain wall moving from the trigger region to the detector region. At its shortest, such path may be defined simply by a inter-electrode gap. Alternatively, and as shown in FIG. 7, such path may be defined by a number of electrodes and inter-electrode gaps. Additionally defined by electrodes may be an origin region adjacent to the trigger region and a confiner region adjacent to at least the detector region.

As shown in the figures, definition of trigger and detector regions may be by several electrodes on one side of a ferroelectric film facing a common electrode on the opposite side. Or, as also shown, electrodes having matching edges may face each other. Yet another possibility consists in electrodes which only partially face each other and whose edges do not match, a case in which regions are defined by facing portions of electrodes.

According to the invention, and in the interest of energy gain, area of detector region is greater than area of trigger region. Moreover, a current sensor is electrically connected to an electrode defining the detector region; such sensor may be, e.g., a load resistor, a ferroelectric device as shown in FIG. 11 and 12, or a semiconductor device.

Among ferroelectric materials suitable for the implementation of devices according to the invention are gadolinium molybdate, $Gd_2(MoO_4)_3$, and lead germanate, $Pb_5Ge_3O_{11}$. While the former material allows only planar domain walls which extend to the crystal boundary, the latter allows domain wall shape to be determined by electrode geometry. Both materials have desirably high Curie temperature, and gadolinium molybdate further has the desirable property of being highly resistant to spontaneous nucleation (a property which may also be realizable in lead germanate).

Devices may be implemented using single crystal ferroelectric films, preferably having a thickness in a preferred range of 1-100 micrometer and conveniently produced, e.g., by hetero-epitaxy on a suitable crystal substrate. Electrodes may be deposited directly on the ferroelectric film, in which case removal of the substrate (e.g., by etching) is required prior to deposition of electrodes. Alternatively, it may be possible to choose a substrate material which has sufficient conductivity to serve as an electrode such as, e.g., a common ground electrode. Ferroelectric films may also be self-supporting as produced, e.g., by polishing or etching of saw cut wafers; etching may be preferable for this purpose to permit retention of a thicker rim for support. An exemplary resistive layer may be produced by electron beam evaporation of tin oxide 5000 Angstrom thick and baked to approximately $2 \times 10^6$ Ohm/cm$^2$ resistivity.

I claim:

1. Device comprising (1) at least a first film which is ferroelectric and (2) electrodes which are in electrical contact with facing sides of said film and which define in said film at least (i) a first region here designated trigger region, (ii) a second region here designated detector region, and (iii) a third region here designated connecting region and forming a domain wall motion path between said trigger region and said detector region, said film being such that there is a voltage which, when applied to electrodes on facing sides of said film, is sufficient to produce domain wall motion in said film and which is insufficient to cause nucleation of new ferroelectric domains during an interval of time which is greater than or equal to the length of the path from said connecting region through said detector region divided by the velocity of said motion, said device being CHARACTERIZED IN THAT (a) said detector region has an area which is at least 50 percent greater than the area of said trigger region and (b) an electrode which defines said detector region is electrically connected to a current sensor.

2. Device of claim 1 in which said connecting region is defined by a gap between two adjacent electrodes on said film.

3. Device of claim 1 in which said connecting region comprises a sequence of at least one electrode defined first subregion and at least a second subregion which is adjacent to said first subregion and which is defined by a gap between two adjacent electrodes on said film.

4. Device of claim 1 comprising an electrode which defines in said film a fourth region here designated an origin region, said origin region being adjacent to said trigger region.

5. Device of claim 1 comprising an electrode which defines in said film a fifth region here designated a confiner region, said confiner region being adjacent to at least said detector region.

6. Device of claim 1 in which said current sensor is an electrode defining a region in a second film which is ferroelectric.

7. Device of claim 6 in which said second film is contiguous to said first film.

8. Device of claim 1 in which a resistive layer is on said ferroelectric layer at least between an electrode which defines said trigger region and an electrode which defines said detector region, resistivity of said layer being at least 10 times resistivity of an electrode which defines said trigger region or an electrode which defines said detector region.

9. Device of claim 1 in which said film is ferroelastic.

* * * * *